(12) United States Patent
Yu et al.

(10) Patent No.: US 8,803,323 B2
(45) Date of Patent: Aug. 12, 2014

(54) PACKAGE STRUCTURES AND METHODS FOR FORMING THE SAME

(75) Inventors: Chen-Hua Yu, Hsin-Chu (TW); Jiun Yi Wu, Zhongli (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/539,048

(22) Filed: Jun. 29, 2012

(65) Prior Publication Data

US 2014/0001644 A1    Jan. 2, 2014

(51) Int. Cl.
   *H01L 29/72* (2006.01)
(52) U.S. Cl.
   USPC ............. 257/774; 257/E21.002; 257/E23.067
(58) Field of Classification Search
   USPC ........................... 257/774, E21.002, E23.067
   See application file for complete search history.

(56) References Cited

U.S. PATENT DOCUMENTS

| 5,734,199 A | 3/1998 | Kawakita et al. |
| 2005/0121310 A1* | 6/2005 | Yamada et al. .......... 204/192.12 |
| 2011/0286191 A1* | 11/2011 | Kim et al. ..................... 361/783 |

FOREIGN PATENT DOCUMENTS

KR    100438256    8/2004

* cited by examiner

*Primary Examiner* — Edward Wojciechowicz
(74) *Attorney, Agent, or Firm* — Slater and Matsil, L.L.P.

(57) ABSTRACT

A device includes a first package component and the second package component. The first package component includes a first plurality of connectors at a top surface of the first package component, and a second plurality of connectors at the top surface. The second package component is over and bonded to the first plurality of connectors, wherein the second plurality of connectors is not bonded to the second package component. A solder resist is on the top surface of the first package component. A trench is disposed in the solder resist, wherein a portion of the trench spaces the second plurality of connectors apart from the first plurality of connectors.

13 Claims, 9 Drawing Sheets

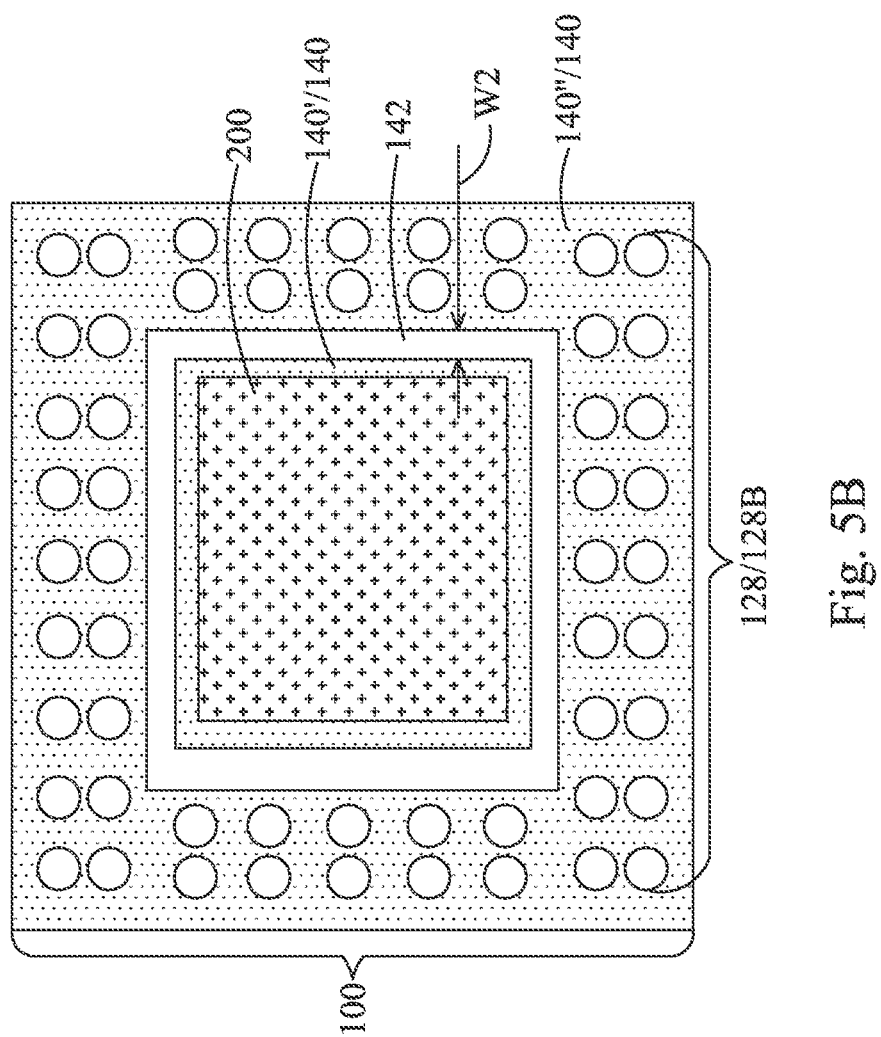

PACKAGE STRUCTURES AND METHODS FOR FORMING THE SAME

BACKGROUND

In a typical Package-on-Package (POP) process, a top package is bonded to a bottom package. The top package and the bottom package may also have device dies therein. By adopting the PoP process, the integration level of the packages is increased.

BRIEF DESCRIPTION OF THE DRAWINGS

For a more complete understanding of the embodiments, and the advantages thereof, reference is now made to the following descriptions taken in conjunction with the accompanying drawings, in which:

FIG. 5B illustrates a top view of the structure shown in FIG. 5A; and

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Package-on-Package (PoP) structure and the methods of forming the same are provided in accordance with various exemplary embodiments. The intermediate stages of forming the package structure are illustrated. The variations of the embodiments are discussed. Throughout the various views and illustrative embodiments, like reference numbers are used to designate like elements.

Figure 1:
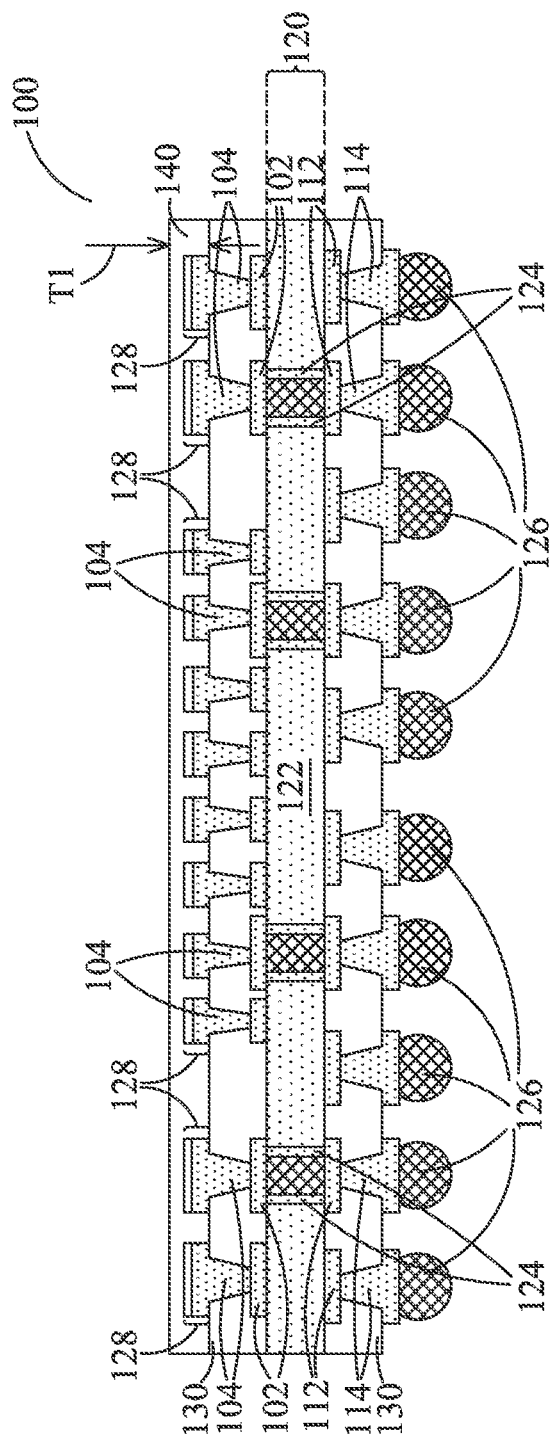
FIGS. 1 through 4 illustrate cross-sectional views and a top view of intermediate stages in the manufacturing of a Package-on-Package (PoP) structure in accordance with some exemplary embodiments.

FIGS. 1 through 4 illustrate the cross-sectional views and a top view of intermediate stages in the formation of a package in accordance with some exemplary embodiments. Referring to FIG. 1, package component 100 is provided. Package component 100 is also referred to as a bottom package or a bottom package component hereinafter. Package component 100 may be a package substrate in accordance with some embodiments. Alternatively, package component 100 may be another type of package components such as an interposer, for example. In some embodiments, package component 100 is a build-up substrate, as illustrated in FIG. 1. In alternative embodiments, package component 100 is a laminate substrate, wherein the respective dielectric layers in package component 100 comprise dielectric films that are laminated together.

Package component 100 may include metal lines 102 and 112 and vias 104 and 114 for interconnecting metal features on opposite sides of package component 100. Metal lines 102/112 and vias 104/114 may be formed in dielectric layers 130. Metal lines 102 are also referred to as metal traces 102 hereinafter. In some embodiments, metal traces 102, which are formed on the topside of package component 100, are electrically coupled to connectors 126, which are on the bottom side of package component 100. The interconnection may be made through electrical connection structure 124, which may include vias and/or metal lines. In some exemplary embodiments, package component 100 includes core 120 that has dielectric substrate 122 and electrical connectors 124 penetrating through dielectric substrate 122. In some embodiments, dielectric substrate 122 is formed of fiber glass, although other dielectric materials may be used. Connectors 126 may be solder balls, for example. Connectors 128 are formed at the top surface of package component 100. Connectors 128 may be metal pads, for example, and may include, for example, a copper pad and a metal finish over the copper pad.

Figure 4:
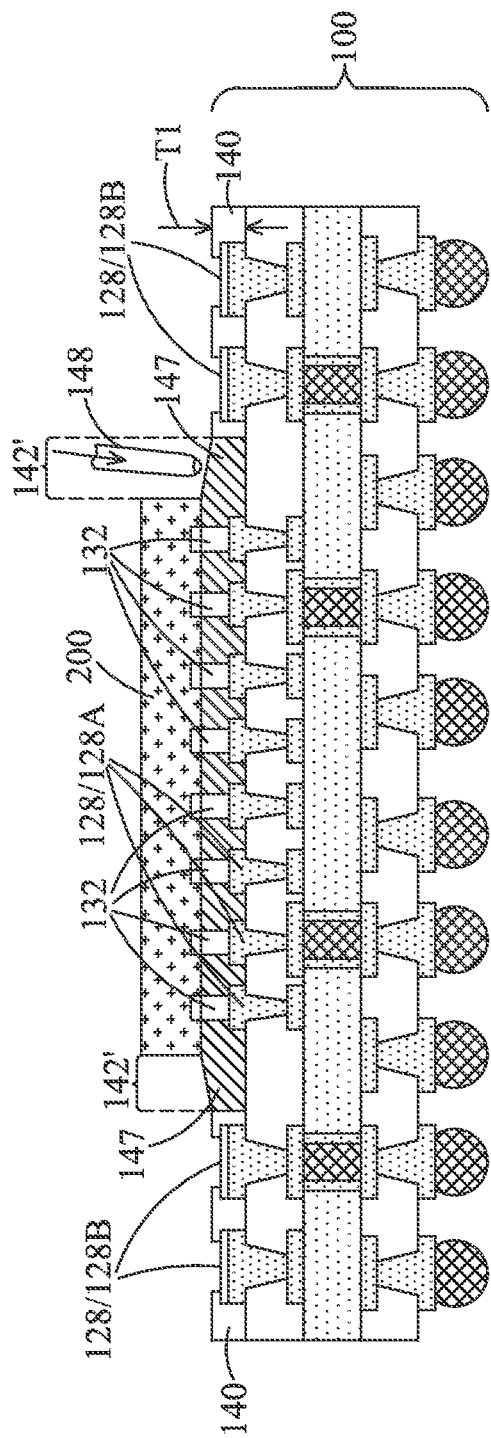
Figure 6:
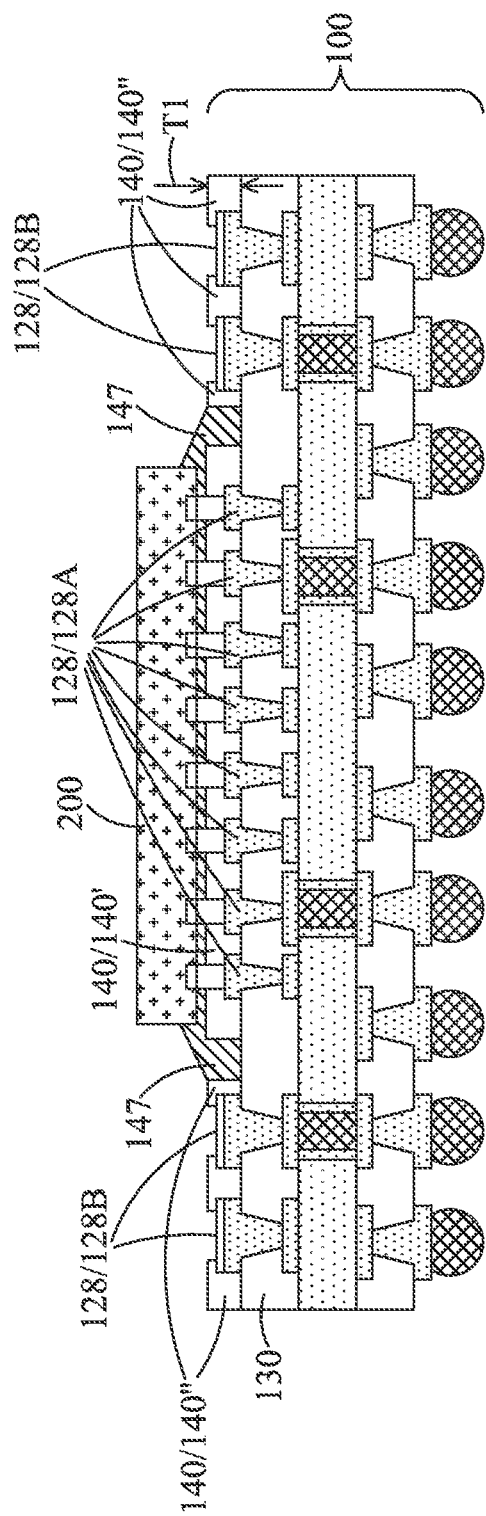

Dielectric layer 140 is formed to cover electrical connectors 128 in order to insulate electrical connectors 128 and the internal metal connections in package component 100 from external detrimental substances such as moisture. Dielectric layer 140 may be a solder resist (sometimes referred to as a solder mask), and hence is alternatively referred to as solder resist 140 throughout the description, although other dielectric materials having adequate insulation ability may also be used. In some embodiments, dielectric layer 140 has thickness T1, which may be greater than about 10 μm, and between about 10 μm and about 70 μm. With a great thickness T1, dielectric layer 140 has better ability in confining underfill 147, as shown in FIGS. 4 and 6.

Figure 2:
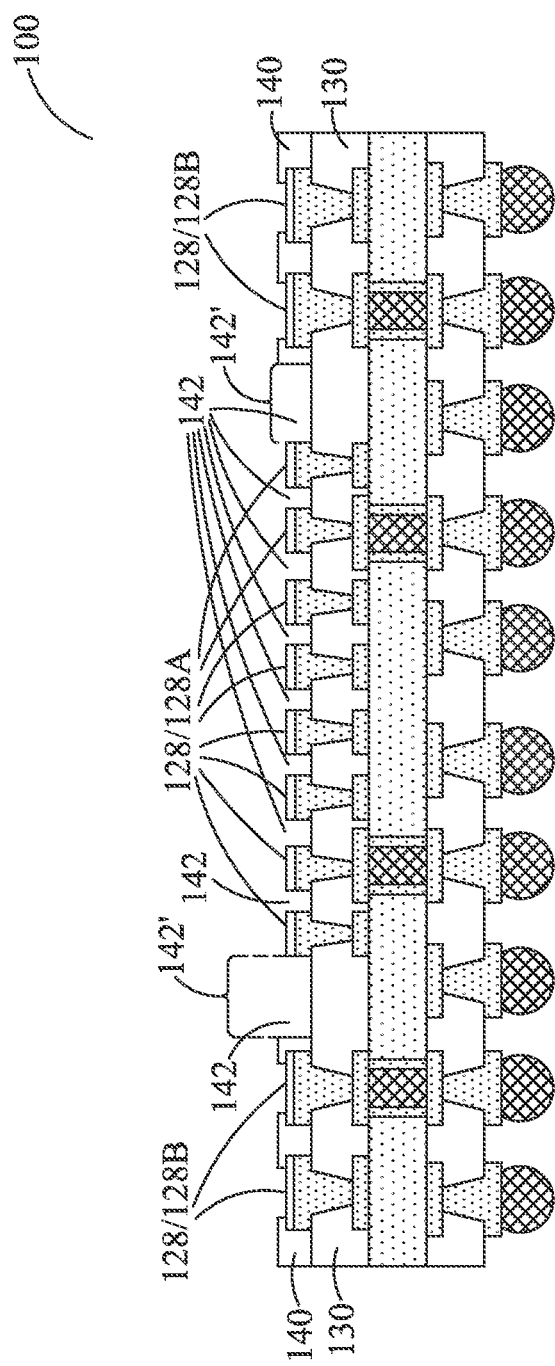

Referring to FIG. 2, a patterning step is performed to remove some portions of solder resist 140, so that electrical connectors 128A and 128B are exposed. The patterning may be performed through an etching step. In the embodiments shown in FIG. 2, the portions of solder resist 140 between neighboring electrical connectors 128A are removed. The spaces left by the removed portions of solder resist 140 are referred to as trenches 142 hereinafter. Trenches 142 comprise portions 142' that separate electrical connectors 128A from the respective neighboring electrical connectors 128B.

The portions of solder resist 140 between neighboring electrical connectors 128B, however, remain not removed by the patterning step. After the patterning of solder resist 140, in addition to the exposure of electrical connectors 128A, the top dielectric layer 130 may also be exposed.

Figure 3A:
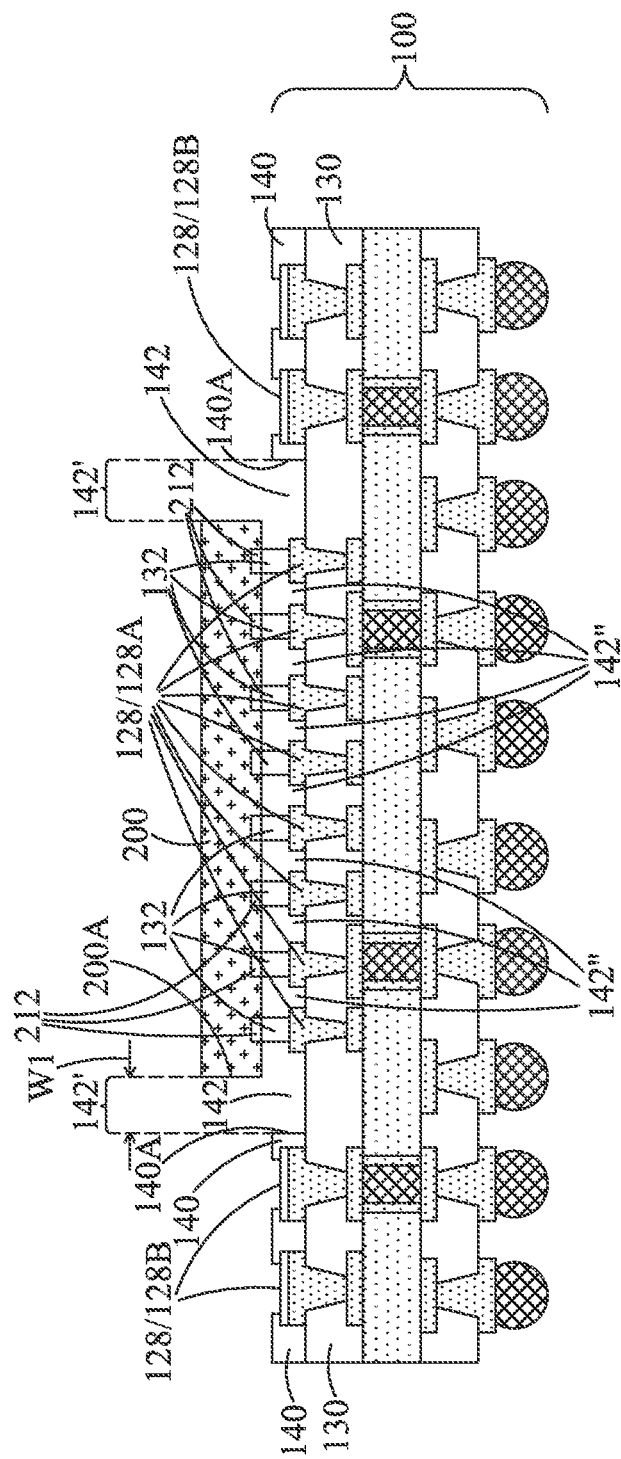

FIG. 3A illustrates the bonding of package components 100 and 200. Package component 200 is also referred to as a top package or a top package component hereinafter. Package component 200 may be a package including a device die that is molded or bonded to another package component. Alternatively, package component 200 may be a device die that includes active devices such as transistors (not shown) therein. Package component 200 includes connectors 212. In some embodiments, connectors 212 include metal pillars. In alternative embodiments, connectors 212 include bond pads. The metal pillars or the bond pads in connectors 212 may be formed of copper or a copper alloy, and may also include additional layers (not shown) such as a nickel layer, a palladium layer, a gold layer, or the like. Package components 100 and 200 may be bonded to each other through solder regions 132, which may be formed of a lead-free solder, a eutectic solder, or the like. The bonding process accordingly includes a reflow process to reflow solder regions 132. Alternatively, other bonding methods such as metal-to-metal direct bonding may be used.

Figure 3B:
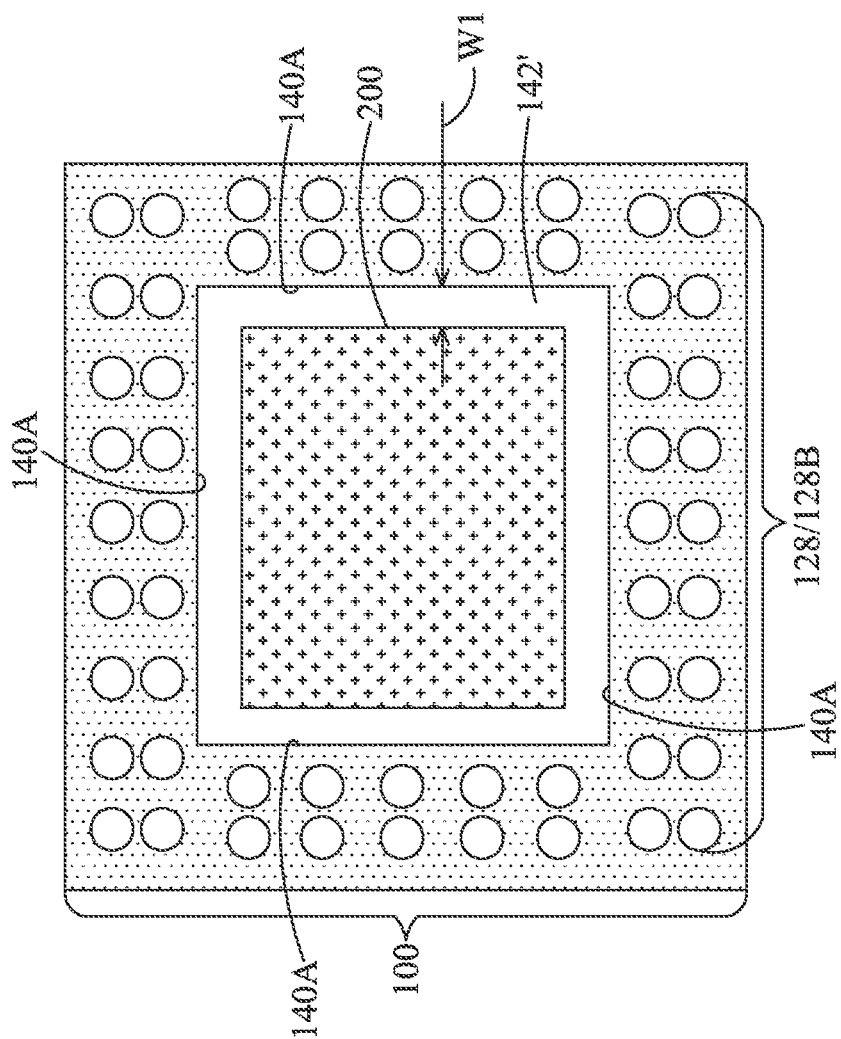

As shown in FIG. 3A, trench 142 in solder resist 140 may include trench ring 142' encircling connectors 128A. FIG. 3B illustrates a top view of the structure in FIG. 3A, wherein trench ring 142' is illustrated as encircling package component 200 in the top view, although in the cross-sectional view as in FIG. 3A, the level of trench ring 142' is lower than that of package component 200.

Referring back to FIG. 3A, trench ring 142' is not overlapped by package component 200. In addition to trench ring 142', trench 142 further includes trench portions 142" that are overlapped by package component 200. In these embodiments, since the portions of solder resist 140 between neighboring connectors 128A are also removed, solder resist 140 may be free from, or substantially free from, portions that are overlapped by package component 200. These embodiments may also be treated as that the portions of solder resist 140 inside trench ring 142' are removed.

Trench ring 142' has width W1, which may be between 50 μm and about 1,000 μm. Width W1 is also the horizontal distance from the edge 200A of package component 200 to the respective nearest sidewalls 140A of solder resist 140. As also shown in FIG. 3B, which is the top view of the structure in FIG. 3A, trench ring 142' has outer sidewalls 140A, which are also the sidewalls of solder resist 140. Outer sidewalls 140A form a sidewall ring that encircles trench ring 140', which further encircles connectors 128A and package component 200. In the embodiments shown in FIG. 3B, none of connectors 128 are disposed between sidewall ring 140A and package component 200.

FIG. 4 illustrates the dispensing of underfill 147 into the gap between package components 100 and 200. In some embodiments, underfill 147 is dispensed through dispenser 148, and is dispensed from a location adjacent to an edge of package component 200. Through the capillary effect, underfill 147 spreads to the entire gap. Due to the existence of trench ring 142', underfill 147 is confined in trench ring 142' and the region encircled by trench ring 142'. Accordingly, underfill 147 is not spread to over connectors 128B. Since underfill 147 is a dielectric material, if it is spread onto connectors 128B, the electrical connection between connectors 128B to the package components (not shown) that are to be bonded to connectors 128B will be adversely affected. Accordingly, the formation of trench 142, which includes trench ring 142', is beneficial to the yield improvement in the packaging. To improve the confinement effect, thickness T1 of solder resist 140 may be increased to a desirable value, such as between about 10 μm and about 70 μm.

Figure 5A:
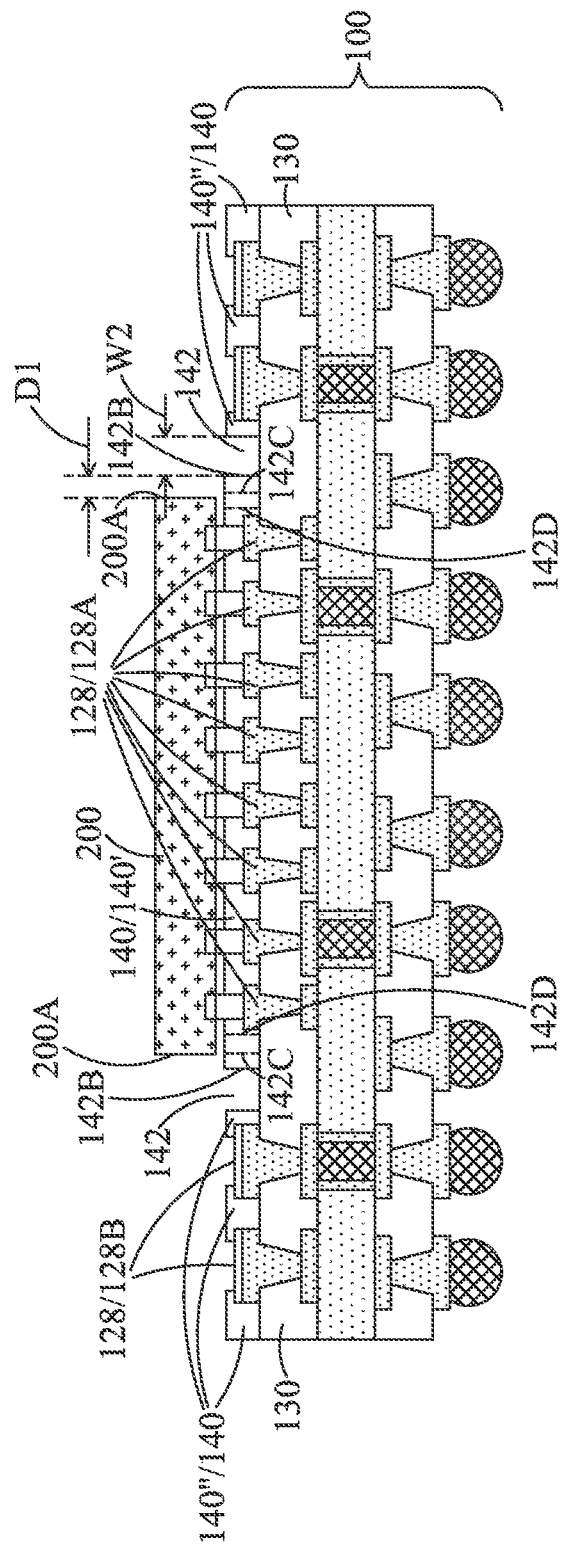
FIGS. 5A and 6 illustrate cross-sectional views of intermediate stages in the manufacturing of a PoP structure in accordance with alternative embodiments.

FIGS. 5A through 6 illustrate the cross-sectional views and the top view in the formation of a PoP structure in accordance with alternative embodiments. Unless specified otherwise, the materials and formation methods of the components in these embodiments are essentially the same as the like components, which are denoted by like reference numerals in the embodiments shown in FIGS. 1 through 4. The details of the like components shown in FIGS. 5A through 6 may thus be found in the discussion of the embodiments shown in FIGS. 1 through 4.

The initial steps of these embodiments are essentially the same as shown in FIGS. 1 through 3B, except that in the patterning of solder resist 140, the portions of solder resist 140 between neighboring connectors 128A are not removed. After the patterning of solder resist 140, package components 100 and 200 are bonded, and the resulting package is shown in FIGS. 5A and 5B. As shown in FIG. 5A, trench ring 142 is formed in solder resist 140. The patterned solder resist 140 includes portion 140' that is encircled by trench ring 142, and portions 140" that are outside the region encircled by trench ring 142.

In some embodiments, an entirety of trench ring 142 is not overlapped by package component 200. The inner edges 142B of trench ring 142 is spaced apart from edge 200A of package component 200 by distance D1, which may be smaller than about 1,000 μm, and may be between about 25 μm and about 1,000 μm. In alternative embodiments, the inner edges (illustrated using dashed lines 142C) of trench ring 142 are vertically aligned to edges 200A of package component 200. In yet alternative embodiments, the inner edges (illustrated using dashed lines 142D) of trench ring 142 are overlapped by package component 200. FIG. 5B illustrates the top view of the structure shown in FIG. 5A, wherein the exemplary positions of portions 140' and 140" of solder resist 140 and trench ring 142 are illustrated.

FIG. 6 illustrates the dispensing of underfill 147. Similar to the embodiments shown in FIG. 4, trench ring 142 confines underfill 147, and prevents underfill 147 from flowing to connectors 128B. In the dispensing of underfill 147, underfill 147 may flow into trench 142. Trench ring 142, however, with a suitable thickness T1, will stop underfill 147 to further flow to connectors 128.

Figure 7:
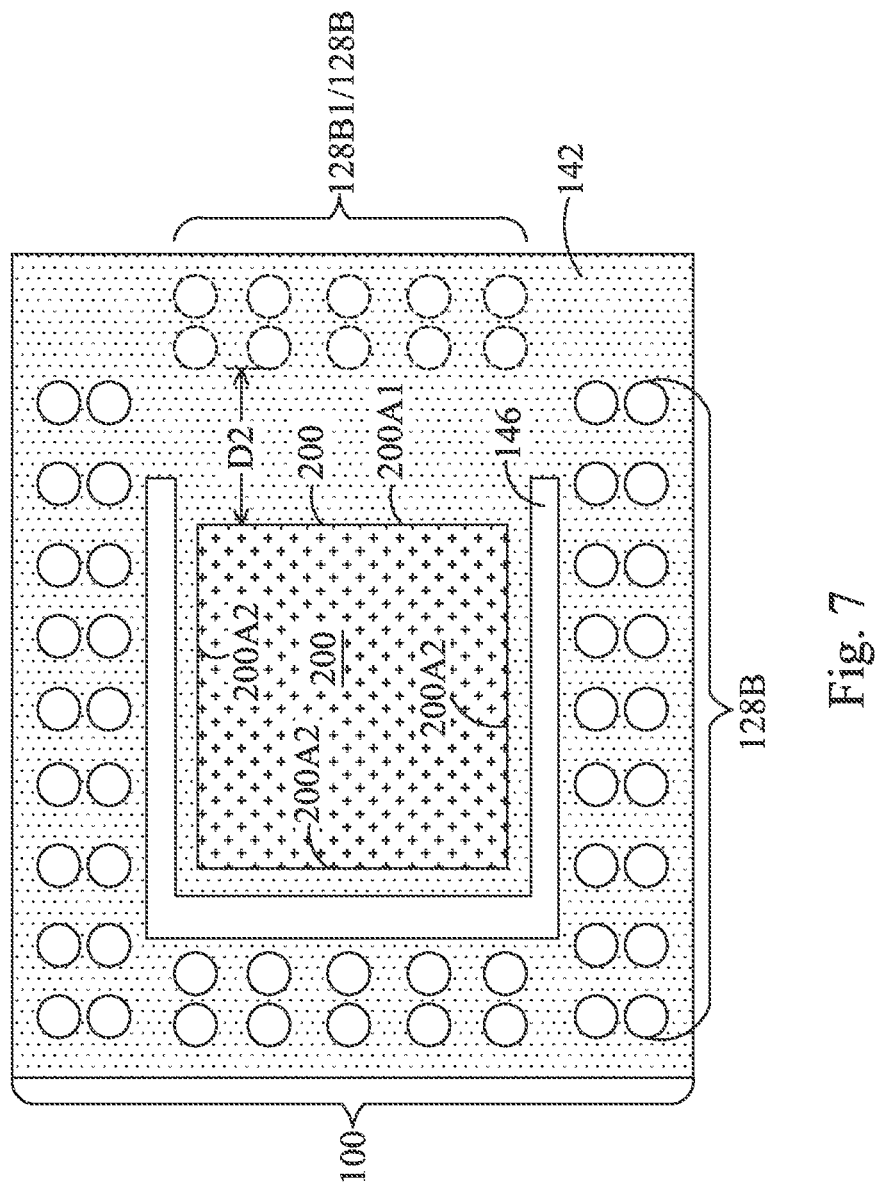
FIG. 7 illustrates a top view of a PoP structure in yet alternative embodiments.

In the embodiments shown in FIGS. 1 through 6, trench 142 may form a full ring encircling package component 200. In alternative embodiments, trench 142 may not form a full ring. For example, as shown in FIG. 7, if there is no connectors 128B adjacent to edge 200A1 of package component 200, or the distance D2 between connectors 128B1 and the nearest edge 200A1 of package component 200 is great enough, for example, with distance D2 greater than about 1,000 μm, then there is no concern that underfill 147 will flow to connectors 128B1. Accordingly, trench 142 may not need to be formed adjacent to edge 200A1. Trench 142, however, may still be formed adjacent to edges 200A2 of package component 200.

In the embodiments, by forming trenches in the solder resists and adjacent to the edges of the top package components in PoP structures, the trenches may act as the stoppers for the underfill that is dispensed between the top package components and the respective bottom package components. Accordingly, the risk of having underfill flowing to the unbonded connectors is reduced.

In accordance with embodiments, a device includes a first package component and the second package component. The first package component includes a first plurality of connectors at a top surface of the first package component, and a second plurality of connectors at the top surface. The second package component is over and bonded to the first plurality of connectors, wherein the second plurality of connectors is not bonded to the second package component. A solder resist is on the top surface of the first package component. A trench is disposed in the solder resist, wherein a portion of the trench spaces the second plurality of connectors apart from the first plurality of connectors.

In accordance with other embodiments, a device includes a package substrate, which further includes a first plurality of connectors at a top surface of the package substrate, and a second plurality of connectors at the top surface and encircling the first plurality of connectors. A top package component is over and bonded to the first plurality of connectors. A solder resist is on the top surface of the package substrate. A trench is in the solder resist, wherein the trench includes a trench ring encircling the first plurality of connectors. The second plurality of connectors is outside of the trench ring.

In accordance with yet other embodiments, a method includes patterning a solder resist on a top surface of a first package component to expose a first plurality of connectors and a second plurality of connectors, and to form a trench in the solder resist. A portion of the trench spaces the first plurality of connectors apart from the second plurality of connectors. The method further includes bonding a second package component to the first plurality of connectors and over the first package component. After the step of bonding, the second plurality of connectors remains exposed. The trench comprises a portion not overlapped by the second package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
  a first package component comprising:
    a first plurality of connectors at a top surface of the first package component; and
    a second plurality of connectors at the top surface;
  a second package component over and bonded to the first plurality of connectors, wherein the second plurality of connectors is not bonded to the second package component;
  a solder resist on the top surface of the first package component, wherein the gap between the first package component and the second package component is substantially free from the solder resist; and
  a trench in the solder resist, wherein a portion of the trench spaces the second plurality of connectors apart from the first plurality of connectors.

2. The device of claim 1, wherein the trench comprises a trench ring not overlapped by the second package component, and wherein the trench ring encircles the second package component in a top view of the device.

3. The device of claim 1 further comprising an underfill disposed in a gap between the first package component and the second package component, wherein the underfill extends into the trench.

4. The device of claim 3, wherein substantially no underfill extends over portions of the solder resist that are farther away from the first plurality of connectors than the trench.

5. The device of claim 1, wherein the first package component is a package substrate.

6. A device comprising:
  a package substrate comprising:
    a first plurality of connectors at a top surface of the package substrate; and
    a second plurality of connectors at the top surface and encircling the first plurality of connectors;
  a top package component over and bonded to the first plurality of connectors;
  a solder resist on the top surface of the package substrate; and
  a trench in the solder resist, wherein the trench comprises a trench ring encircling the first plurality of connectors, and wherein the second plurality of connectors is outside of the region encircled by the trench ring.

7. The device of claim 6, wherein the trench comprises a portion in a gap between the package substrate and the top package component, and wherein the gap is overlapped by the top package component.

8. The device of claim 7, wherein substantially no solder resist exists in the gap between the package substrate and the top package component.

9. The device of claim 6, wherein the solder resist comprises:
  a first portion encircled by the trench ring, wherein sidewalls of the first portion of the solder resist form a sidewall ring that is exposed to the trench ring; and
  a second portion encircling the trench ring.

10. The device of claim 9, wherein the sidewall ring is larger than, and encircles, the top package component.

11. The device of claim 9, wherein the sidewall ring is substantially vertically aligned to edges of the top package component.

12. The device of claim 9, wherein the sidewall ring is smaller than, and is vertically overlapped by, the top package component.

13. The device of claim 6, wherein an interface between the trench ring and portions of the solder resist outside the trench ring forms a sidewall ring, and wherein no connector is disposed in a region horizontally between edges of the top package component and the sidewall ring.

* * * * *